United States Patent
Rana et al.

(10) Patent No.: US 8,283,199 B2
(45) Date of Patent: Oct. 9, 2012

(54) SOLAR CELL PATTERNING AND METALLIZATION

(75) Inventors: Virendra V. S. Rana, Los Gatos, CA (US); Chris Eberspacher, Palo Alto, CA (US); Karl J. Armstrong, San Jose, CA (US); Nety M. Krishna, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 427 days.

(21) Appl. No.: 12/624,668

(22) Filed: Nov. 24, 2009

(65) Prior Publication Data
US 2010/0190290 A1    Jul. 29, 2010

Related U.S. Application Data

(60) Provisional application No. 61/148,264, filed on Jan. 29, 2009.

(51) Int. Cl.
*H01L 21/28*     (2006.01)
*H01L 21/312*    (2006.01)
*H01L 31/0224*   (2006.01)

(52) U.S. Cl. ... 438/98; 438/748; 438/781; 257/E21.259; 257/E31.124; 136/256

(58) Field of Classification Search .......... 438/748; 257/E21.259, E31.124; 136/255, 256
See application file for complete search history.

(56) References Cited

U.S. PATENT DOCUMENTS

| | | | |
|---|---|---|---|
| 4,610,077 A | 9/1986 | Minahan et al. | |
| 4,948,740 A | 8/1990 | Plaettner | |
| 2006/0105492 A1 | 5/2006 | Veres et al. | |
| 2009/0139568 A1 | 6/2009 | Weidman et al. | |
| 2009/0142880 A1* | 6/2009 | Weidman et al. | 438/98 |
| 2010/0055901 A1 | 3/2010 | Zhang et al. | |

OTHER PUBLICATIONS

M. Aleman et al., "Industrially Feasible Front-Side Metallization Based on Ink-Jet Masking and Nickel Plating." European Photovoltaic Solar Energy Conference, Sep. 1-5, 2008, Valencia, Spain.

* cited by examiner

*Primary Examiner* — Mary Wilczewski
*Assistant Examiner* — Toniae Thomas
(74) *Attorney, Agent, or Firm* — Patterson & Sheridan, LLP (57) ABSTRACT

Embodiments of the present invention generally provide methods for forming conductive structures on the surfaces of a solar cell. In one embodiment, conductive structures are formed on the front surface of a solar cell by depositing a sacrificial polymer layer, forming patterned lines in the sacrificial polymer via a fluid jet, depositing metal layers over the front surface of the solar cell, and performing lift off of the metal layers deposited over the sacrificial polymer by dissolving the sacrificial polymer with a water based solvent. In another embodiment, conductive structures are formed on the back surface of a solar cell by depositing a sacrificial polymer layer, forming patterned lines in the sacrificial polymer via a fluid jet, depositing a metal layer over the back surface of the solar cell, and performing lift off of the metal layer deposited over the sacrificial polymer by dissolving the sacrificial polymer with a water based solvent, and completing selective metallization of the remaining metal lines.

20 Claims, 14 Drawing Sheets

SOLAR CELL PATTERNING AND METALLIZATION

CROSS-REFERENCE TO RELATED APPLICATIONS

This application claims benefit of U.S. provisional patent application Ser. No. 61/148,264, filed Jan. 29, 2009, which is herein incorporated by reference.

BACKGROUND OF THE INVENTION

1. Field of the Invention

Embodiments of the present invention generally relate to the fabrication of photovoltaic devices. In particular, the present invention relates to methods for patterning and metalizing photovoltaic devices.

2. Description of the Related Art

Solar cells are photovoltaic devices that convert sunlight directly into electrical power. The most common solar cell material is silicon, which may be in the form of single or multicrystalline substrates, sometimes referred to as wafers. Because the amortized cost of forming silicon-based solar cells to generate electricity is higher than the cost of generating electricity using traditional methods, there has been an effort to reduce the cost of forming solar cells.

Various approaches enable fabricating current carrying metal lines, or conductors, on solar cells. One prior art method of fabricating the current carrying metal lines in solar cell devices uses a screen printing process in which a metal paste is deposited in a desired pattern on a substrate surface and then annealed. However, several drawbacks exist with this manufacturing method. Current screen printing processes produce grids with broad line widths resulting in a substantial amount of shading of the surface of the solar cell. Additionally, current screen printing pastes contain a substantial amount of frit resulting in high sheet resistance of the metal and high contact resistance to the emitter and base of the solar cell. Further, screen printing metal paste on the relatively thin substrates used in solar cell manufacturing can cause physical damage to the substrate resulting in a lower device yield and corresponding increase in the cost of ownership of the fabrication process.

Therefore, a need for improved methods for forming patterned conductive lines on a surface of a solar cell is needed.

SUMMARY OF THE INVENTION

In one embodiment of the present invention, a method for forming a patterned conductor on a solar cell comprises depositing a sacrificial polymer layer over a surface of the solar cell, directing a fluid stream at the sacrificial polymer layer, removing a portion of the sacrificial polymer layer, depositing a metal containing layer over the solar cell, introducing a water-based solvent to the solar cell, and dissolving the remaining sacrificial polymer layer.

In another embodiment of the present invention, a method for forming a patterned conductor on a solar cell comprises depositing a sacrificial polymer layer over a surface of the solar cell, curing the sacrificial polymer layer to a substantially solid state, directing a water-based fluid stream at the sacrificial polymer layer, removing a portion of the sacrificial polymer layer, depositing a metal containing seed layer over the solar cell, introducing a water-based solvent to the solar cell, and dissolving the remaining sacrificial polymer layer to remove a portion of the metal containing layer deposited over the sacrificial polymer layer. In one embodiment, the sacrificial polymer layer comprises a water soluble material. In one embodiment, one or more lines are formed through the sacrificial polymer layer.

In yet another embodiment, a method for forming a patterned conductor on a solar cell comprises depositing a sacrificial polymer layer over an antireflective layer formed over a surface of the solar cell, heating the sacrificial polymer layer to cure the polymer to a substantially solid state, directing a jet of deionized water at the sacrificial polymer layer, removing a portion of the sacrificial polymer layer by forming one or more lines through the sacrificial polymer layer, laser ablating a portion of the antireflective layer exposed by forming the lines, depositing a metal containing layer over the solar cell, introducing deionized water to the solar cell, and dissolving the remaining sacrificial polymer layer to remove a portion of the metal containing layer deposited over the sacrificial polymer layer. In one embodiment, the sacrificial polymer layer comprises polyvinyl acetate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide methods for forming conductive structures on the surfaces of a solar cell. In one embodiment, conductive structures are formed on the front surface of a solar cell by depositing a sacrificial polymer layer, forming patterned lines in the sacrificial polymer via a fluid jet, depositing metal layers over the front surface of the solar cell, and performing lift off of the metal layers deposited over the sacrificial polymer by dissolving the sacrificial polymer with a water based solvent. In another embodiment, conductive structures are formed on the back surface of a solar cell by depositing a sacrificial polymer layer, forming patterned lines in the sacrificial polymer via a fluid jet, depositing a metal layer over the back surface of the solar cell, and performing lift off of the metal layer deposited over the sacrificial polymer by dissolving the sacrificial polymer with a water based solvent, and completing selective metallization of the remaining metal lines.

Figure 1A:
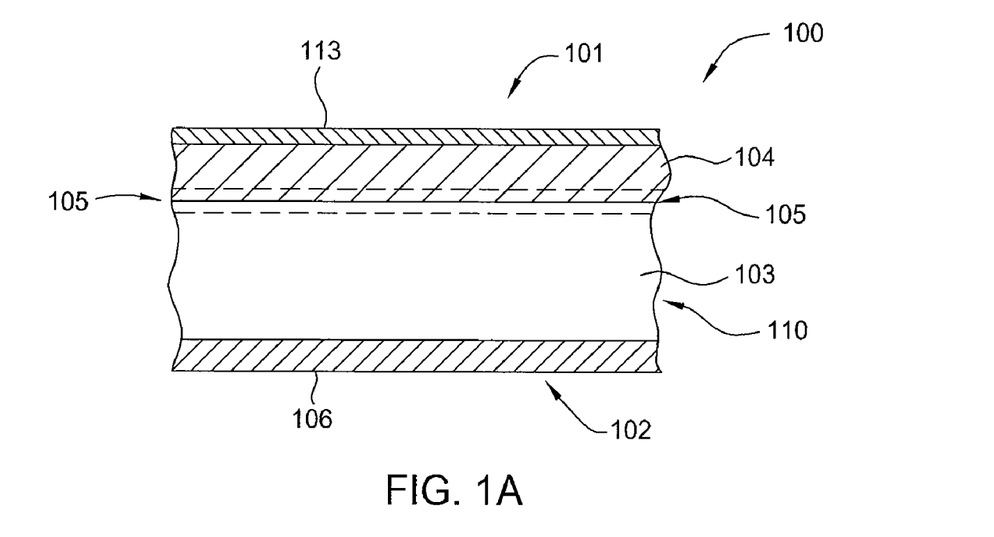
FIG. 1A is a schematic, cross-sectional view of a solar cell prior to forming conductors in a pattern on a front side of the solar cell.
Figure 1B:
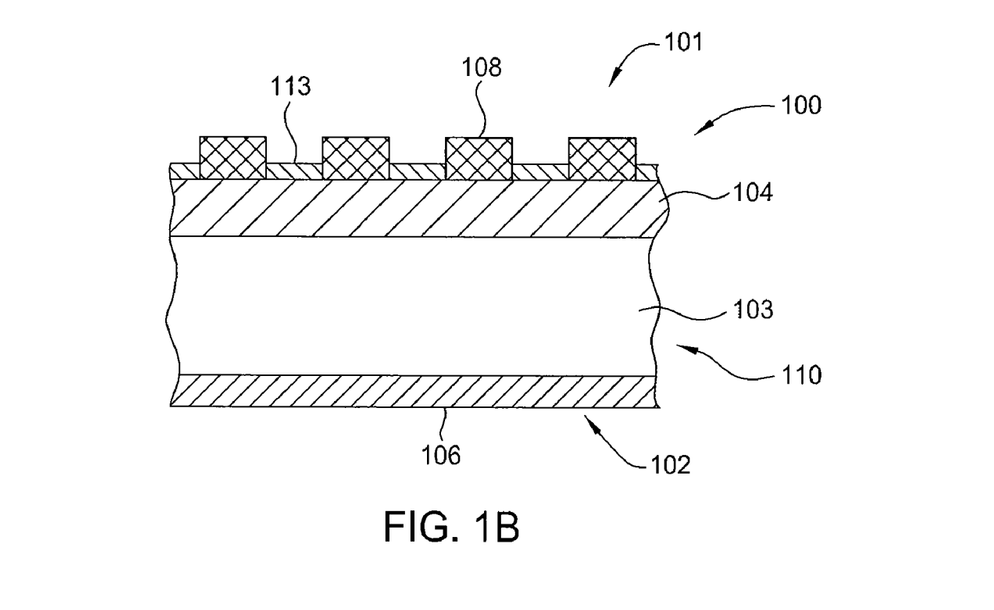
FIG. 1B is a schematic, cross-sectional view of the solar cell shown in FIG. 1A after forming conductors in a pattern on the front side of the solar cell.

FIG. 1B schematically depicts a silicon solar cell 100 fabricated on a substrate 110 from an intermediate state shown FIG. 1A. The substrate 110 includes a p-type base region 103, an n-type emitter region 104, and a p-n junction region 105 disposed therebetween. When sunlight strikes the solar cell 100, energy from incident photons generates electron-hole pairs on both sides of the p-n junction region 105. Electrons diffuse across the p-n junction region 105 to a lower energy level and holes diffuse in the opposite direction, creating a negative charge on the emitter region 104 as a corresponding positive charge builds up in the base region 103.

Electrical current flows when an electrical circuit is made between the emitter region 104 and the base region 103 as the p-n junction 105 is exposed to certain wavelengths of light. The electrical current flows through front contact lines 108 disposed on the front side 101, i.e., the light-receiving side, and a back contact 106 disposed on the backside 102 of the solar cell 100.

The front contact lines 108 are generally widely-spaced thin metal lines that supply current to larger bus bars (not shown) transversely oriented to the metal lines. The solar cell 100 may be covered with an antireflective coating (ARC) layer 113. The ARC layer 113 may comprise a dielectric material, such as silicon nitride ($Si_3N_4$), which acts to minimize light reflected from the top surface of the solar cell 100.

The front contact lines 108 form an ohmic connection with the emitter region 104 of the substrate 110. The back contact 106 completes the electrical circuit required for the solar cell 100 to produce a current by forming an ohmic connection with the base region 103 of the substrate 110.

Figure 5:
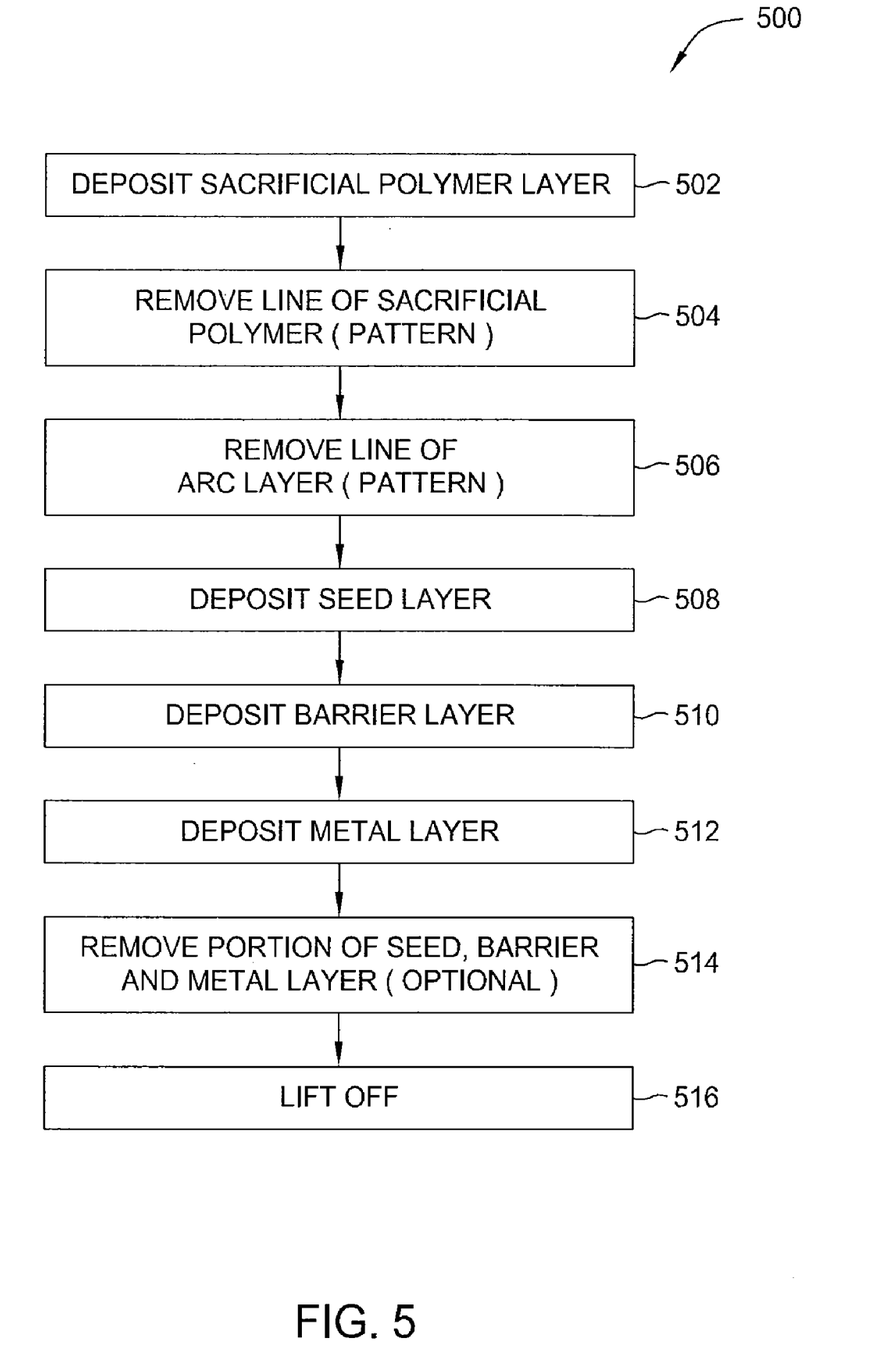
FIG. 5 depicts a processing sequence for forming conductors in a pattern on a solar cell according to one embodiment of the present invention.

FIGS. 2A-2H are schematic, cross-sectional views of the solar cell 100 from FIG. 1A during different stages in a processing sequence 500 for forming conductive contacts on the front side of the solar cell 100 according to one embodiment of the present invention. Correspondingly, FIG. 5 illustrates the processing sequence 500 for forming conductive contacts on the solar cell 100 as shown in FIGS. 2A-2H.

Figure 2A:
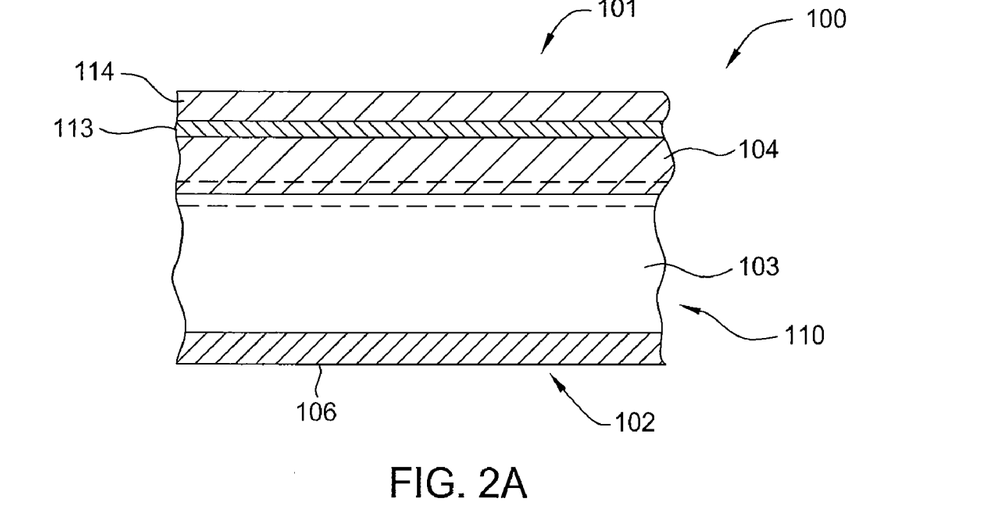
FIGS. 2A-2H are schematic, cross-sectional views of the solar cell in FIG. 1A during different stages in a processing sequence according to one embodiment of the present invention.

In step 502, as illustrated in FIG. 2A, a sacrificial polymer layer 114 is deposited over the ARC layer 113. In one embodiment, the sacrificial polymer layer 114 comprises a water soluble material, such as polyvinyl acetate (PVA). In one embodiment, the sacrificial polymer layer 114 is formed to a thickness of at least about 200 Å. In one embodiment, the sacrificial polymer layer 114 is cured at a temperature from between about 100° C. to about 400° C. After curing, the sacrificial polymer layer 114 comprises a substantially solid layer of water soluble material covering the front side of the solar cell 100.

Figure 2B:
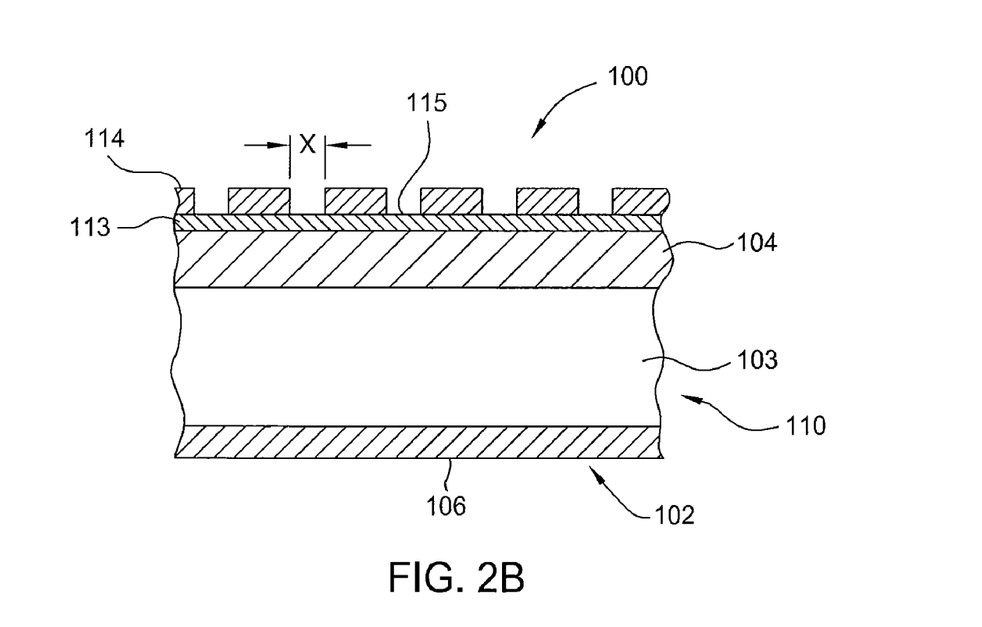

In step 504, as illustrated in FIG. 2B, one or more thin lines 115 of the sacrificial polymer layer 114 are removed via a high speed fluid jet. In one embodiment, the fluid used to remove the lines 115 of the sacrificial polymer layer 114 is a water-based solvent. In one embodiment, the fluid used to remove the lines 115 of the sacrificial polymer layer 114 is deionized water. In one embodiment, the sacrificial polymer layer 114 is removed in lines 115 each having a width (X) from about 25 microns to about 50 microns. In one embodiment, the sacrificial polymer layer 114 is removed in lines 115 each having a width (X) from about 25 microns to about 30 microns.

Figure 2C:
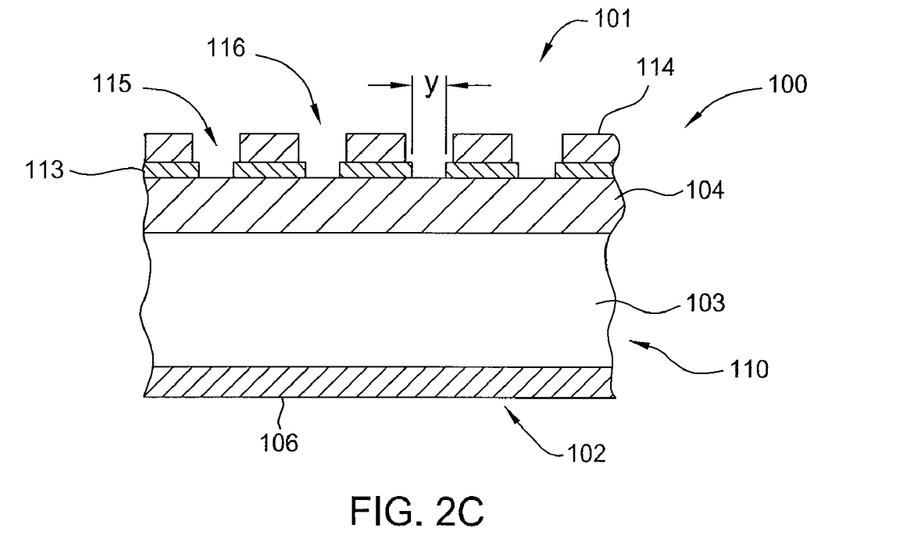

In step 506, the portion of the ARC layer 113 exposed by the removal of the thin lines 115 of sacrificial polymer layer 114 in step 504 is removed as depicted in FIG. 2C. That is, thin lines 116 of the ARC layer 113 are removed corresponding to the thin lines 115 of previously removed sacrificial polymer layer 114. In one embodiment, the thin lines 116 of the ARC layer 113 are removed via a wet etching process. In another embodiment, the thin lines 116 of the ARC layer 113 are removed via a laser ablation process. In the latter embodiment, the width (Y) of each of the thin lines 116 of the ARC layer 113 may be less than the width (X) of each of the thin lines 115 of the sacrificial polymer layer 114 removed in step 504 and shown in FIG. 2B.

Figure 2D:
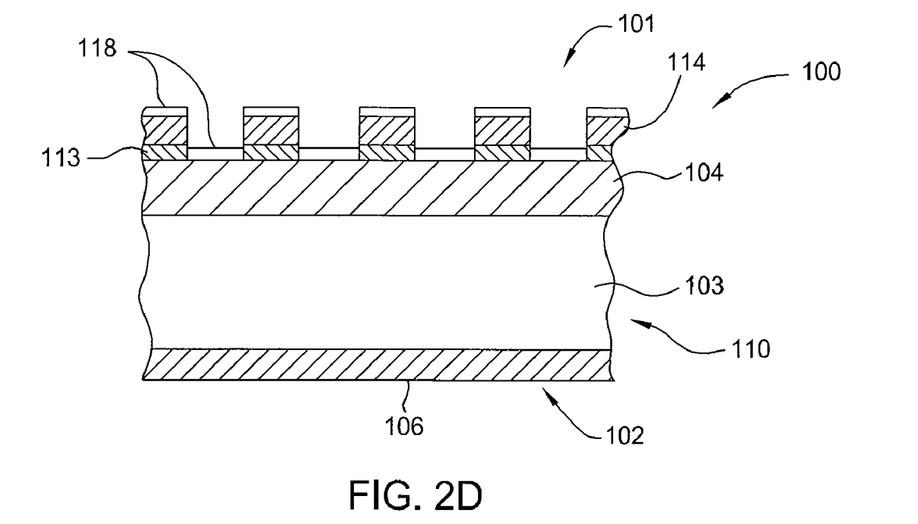

In step 508, a nickel (Ni) or titanium (Ti) seed layer 118 is deposited as shown in FIG. 2D. In one embodiment, the layer 118 may be deposited via physical vapor deposition (PVD) or evaporation. In one embodiment, the seed layer 118 is deposited at a thickness of less than about 200 Å.

Figure 2E:
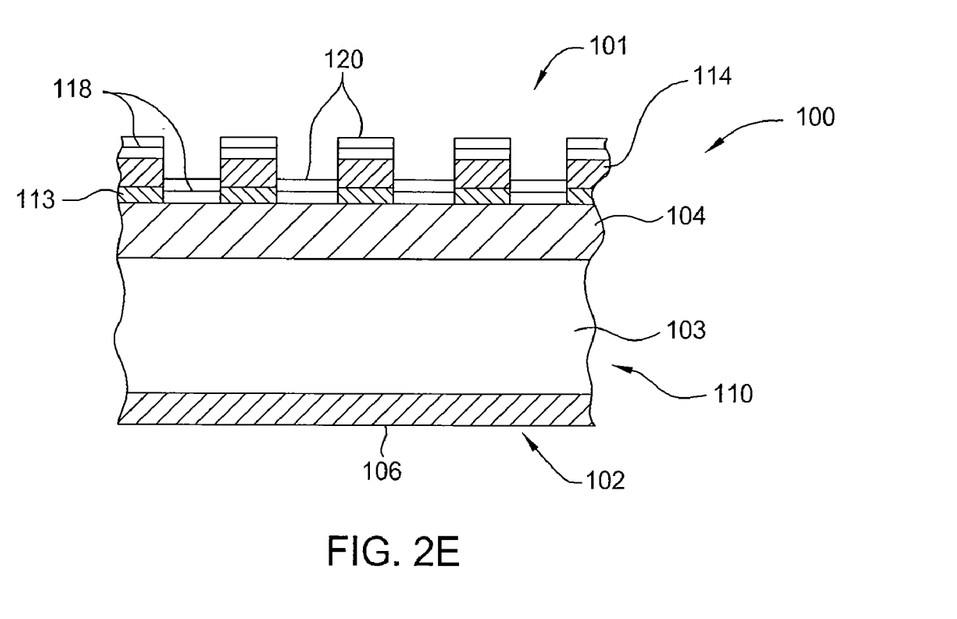

Step 508 is followed by the deposition of a barrier layer 120, such as titanium nitride (TiN), in step 510 as shown in FIG. 2E. In one embodiment, the barrier layer 120 may be deposited via physical vapor deposition (PVD) or evaporation. In one embodiment, the barrier layer 120 is deposited at a thickness of less than about 200 Å.

Figure 2F:
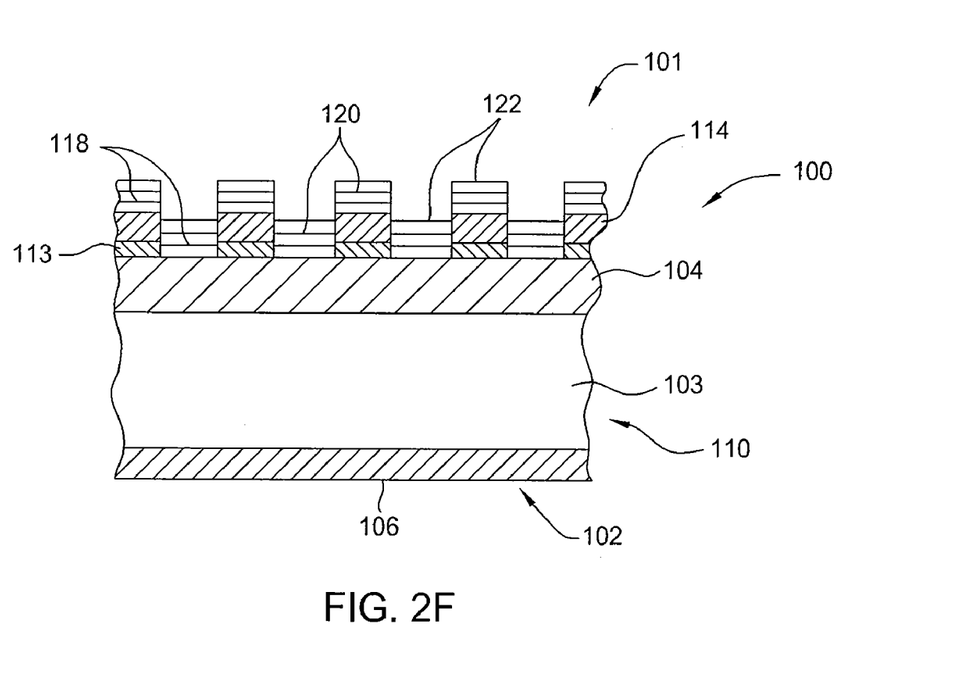

In step 512, a metal layer 122, such as a copper (Cu) layer, is deposited over the barrier layer 120 as shown in FIG. 2F. In one embodiment, the metal layer 122 may be deposited via physical vapor deposition (PVD), evaporation, or electroplating.

Figure 2G:
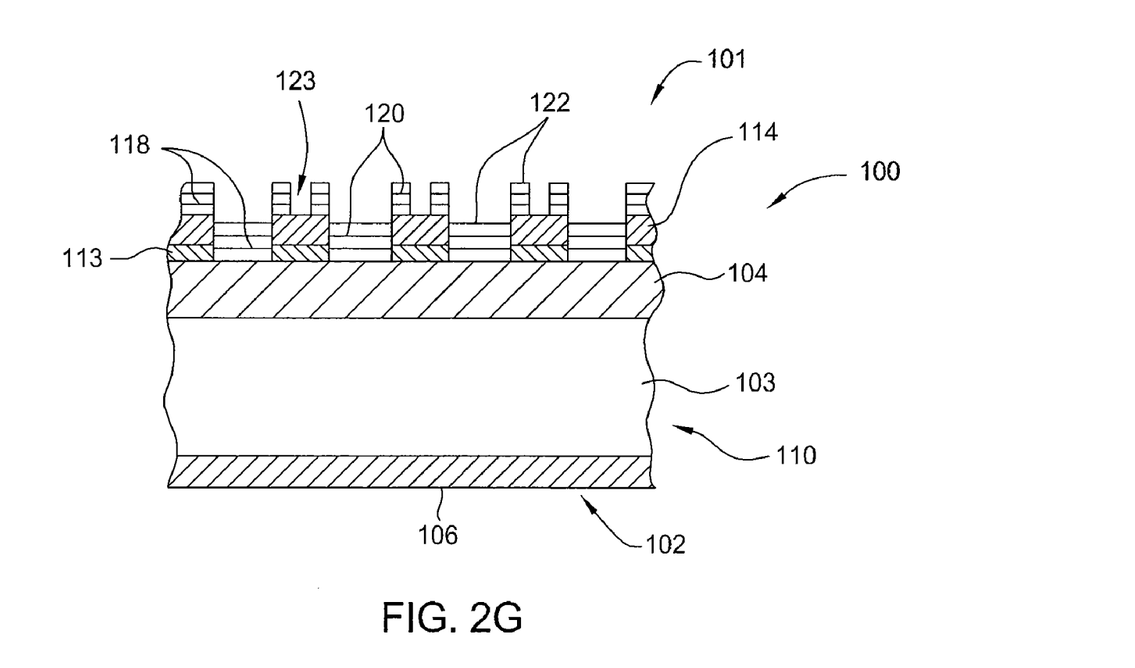

In optional step 514, selective portions of the metal layer 122, the barrier layer 120, and the seed layer 118 that are deposited over the sacrificial polymer layer 112 are removed as shown in FIG. 2G to form openings 123. In one embodiment, the openings 123 in the layers 122, 120, and 118 are selectively formed via a laser ablation technique.

Figure 2H:
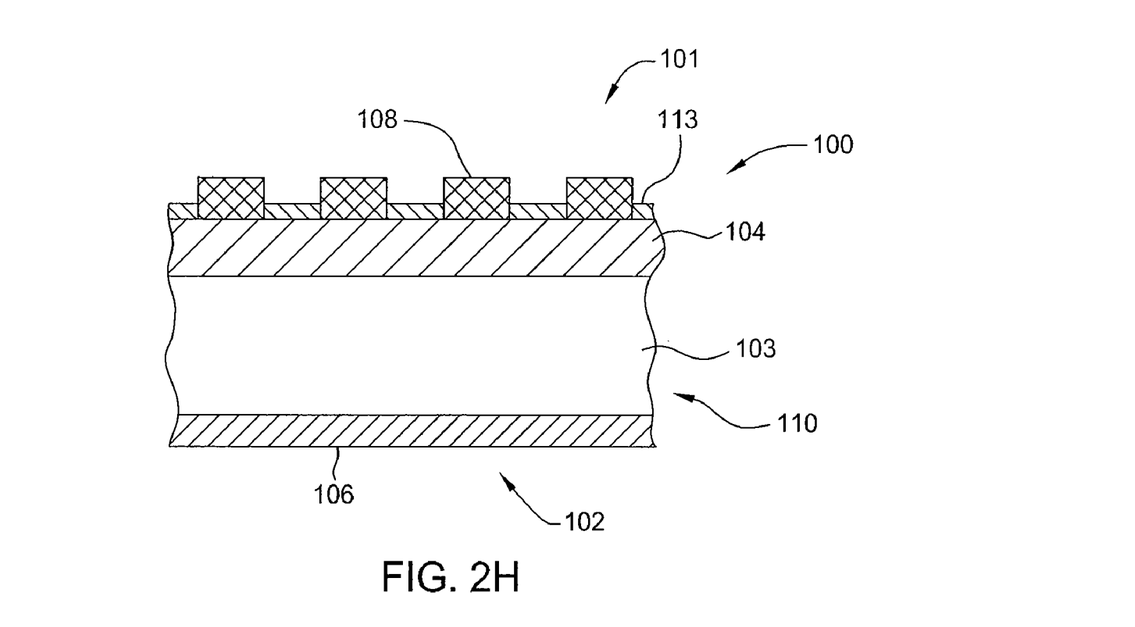

In step 516, a water-based solvent is introduced to the front side of the solar cell 100. In one embodiment, the water-based solvent is deionized water. The water-based solvent migrates through any openings provided in the layers 122, 120, and 118 to contact the sacrificial polymer layer 114. The water-based solvent dissolves the sacrificial polymer layer 114 allowing lift off of the layers 122, 120, and 118 that were deposited over the sacrificial polymer layer 114 leaving a solar cell 100 with one or more front contact lines 108 formed on the front surface thereof as shown in FIG. 2H.

Figure 3A:
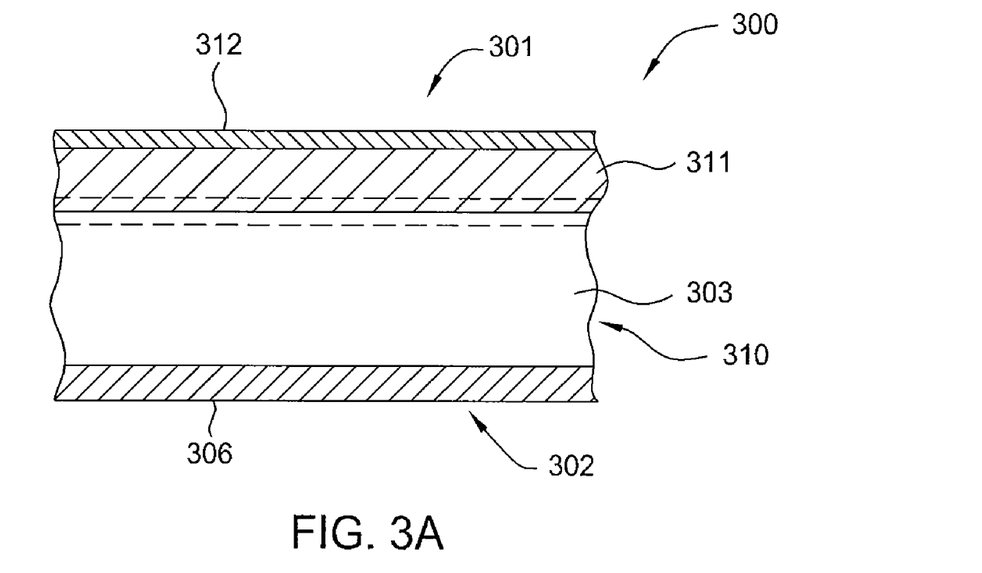
FIG. 3A is a schematic, cross-sectional view of a heterojunction solar cell prior to forming conductors in a pattern on a front side of the solar cell.
Figure 3B:
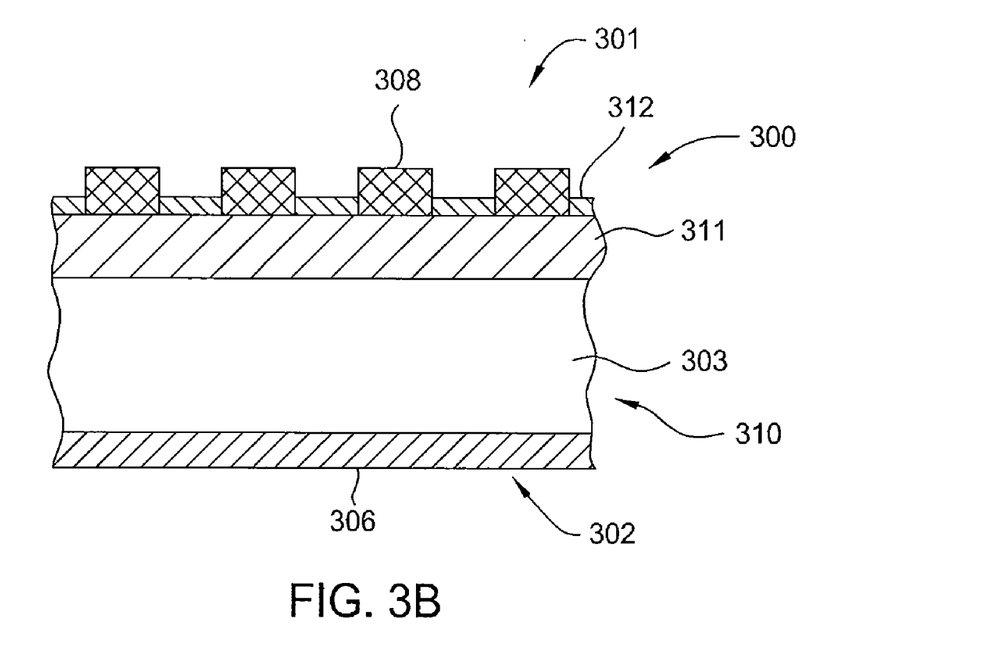
FIG. 3B is a schematic, cross-sectional view of the heterojunction solar cell in FIG. 3A after forming the conductors in a pattern on the front side of the solar cell.

FIG. 3B schematically depicts a heterojunction solar cell 300 fabricated on a substrate 310 from an intermediate state shown FIG. 3A. The solar cell 300 comprises an active region 311 formed over the front surface 301 of the substrate 310. In one example, the heterojunction solar cell 300 is formed by depositing an intrinsic silicon containing layer and then depositing a doped silicon containing layer on the front surface 301 of the substrate 310 by conventional means. The solar cell 300 further comprises a transparent conductive oxide (TCO) layer 312 deposited over the active region 311. The TCO layer 312 may comprise tin oxide, zinc oxide, indium tin oxide, cadmium stannate, combinations thereof, or other suitable materials.

Electrical current flows when an electrical circuit is made between the active region 311 and a base region 303 of the substrate 310 the solar cell 300 is exposed to certain wavelengths of light. The electrical current flows through front contact lines 308 disposed on the front side 301, i.e., the light-receiving side, and a back contact 306 disposed on the backside 302 of the solar cell 300.

FIGS. 4A-4F are schematic, cross-sectional views of the solar cell 300 from FIG. 3A during different stages in a processing sequence 500 for forming conductive contacts on the front side of the solar cell 300 according to one embodiment of the present invention. Correspondingly, FIG. 5 illustrates the processing sequence 500 for forming conductive contacts on the solar cell 300 as shown in FIGS. 4A-4F.

Figure 4A:
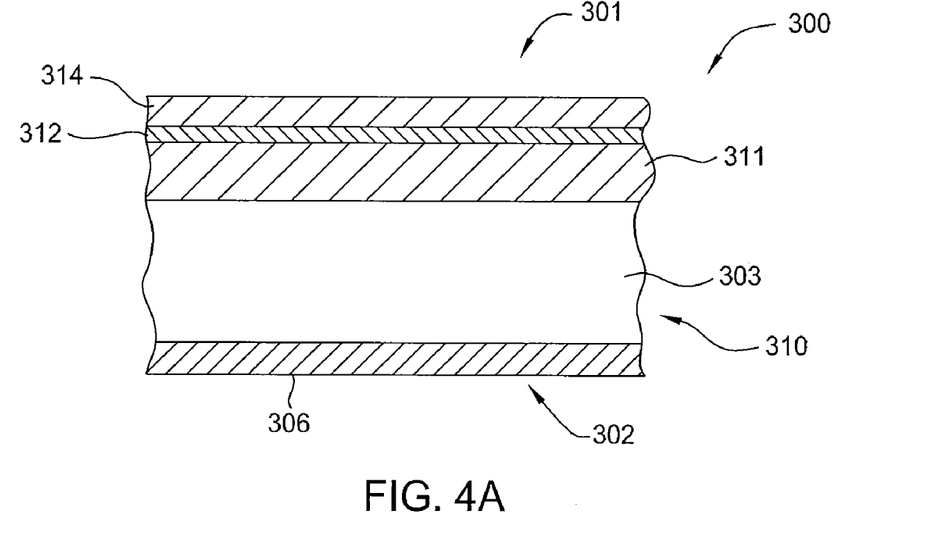
FIGS. 4A-4F are schematic, cross-sectional views of the solar cell in FIG. 3A during different stages in a processing sequence according to another embodiment of the present invention.

In step 502, as illustrated in FIG. 4A, a sacrificial polymer layer 314 is deposited over the TCO layer 312. In one embodiment, the sacrificial polymer layer 314 comprises a water soluble material, such as polyvinyl acetate (PVA). In one embodiment, the sacrificial polymer layer 314 is formed to a thickness of at least about 200 Å. In one embodiment, the sacrificial polymer layer 314 is cured at a temperature from between about 100° C. to about 400° C. After curing, the sacrificial polymer layer 314 comprises a substantially solid layer of water soluble material covering the front side of the solar cell 300.

Figure 4B:
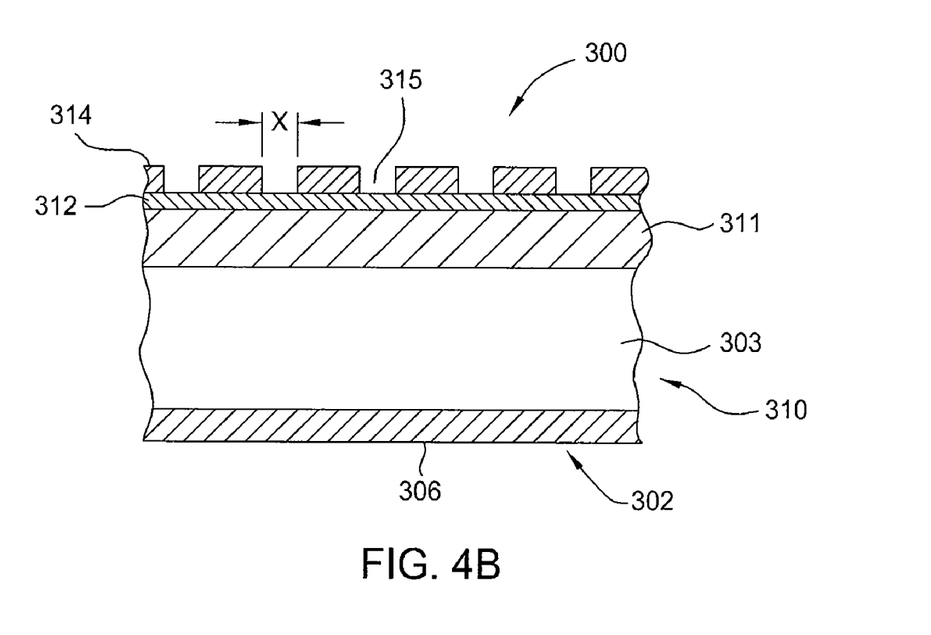

In step 504, as illustrated in FIG. 4B, one or more thin lines 315 of the sacrificial polymer layer 314 are removed via a high speed fluid jet. In one embodiment, the fluid used to remove the lines 315 of the sacrificial polymer layer 314 is a water-based solvent. In one embodiment, the fluid used to remove the lines 315 of the sacrificial polymer layer 314 is deionized water. In one embodiment, the sacrificial polymer layer 314 is removed in lines 315 each having a width (X) from about 25 microns to about 50 microns. In one embodiment, the sacrificial polymer layer 314 is removed in lines 314 each having a width (X) from about 25 microns to about 30 microns.

Figure 4C:
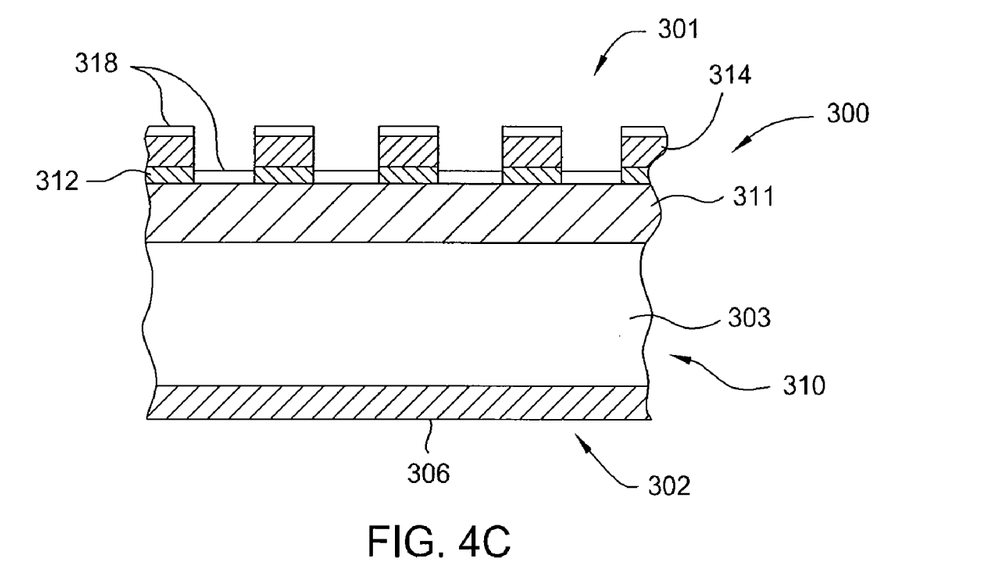

In step 508, seed layer 318 is deposited as shown in FIG. 4C. In one embodiment, the seed layer 318 may be deposited via physical vapor deposition (PVD) or evaporation. In one embodiment, the seed layer 318 is deposited at a thickness of less than about 200 Å. In one embodiment, the seed layer 318 may comprise nickel (Ni) or titanium (Ti).

Figure 4D:
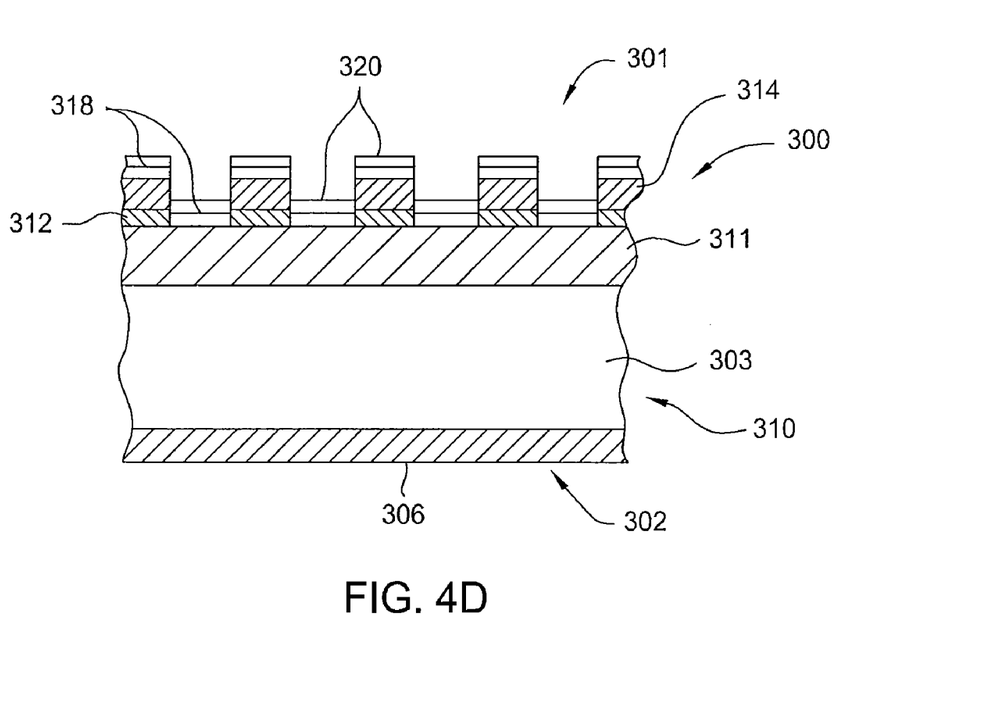

Step 508 is followed by the deposition of a barrier layer 320, such as titanium nitride (TiN), in step 510 as shown in FIG. 4D. In one embodiment, the barrier layer 320 may be deposited via physical vapor deposition (PVD) or evaporation. In one embodiment, the barrier layer 320 is deposited at a thickness of less than about 200 Å.

Figure 4E:
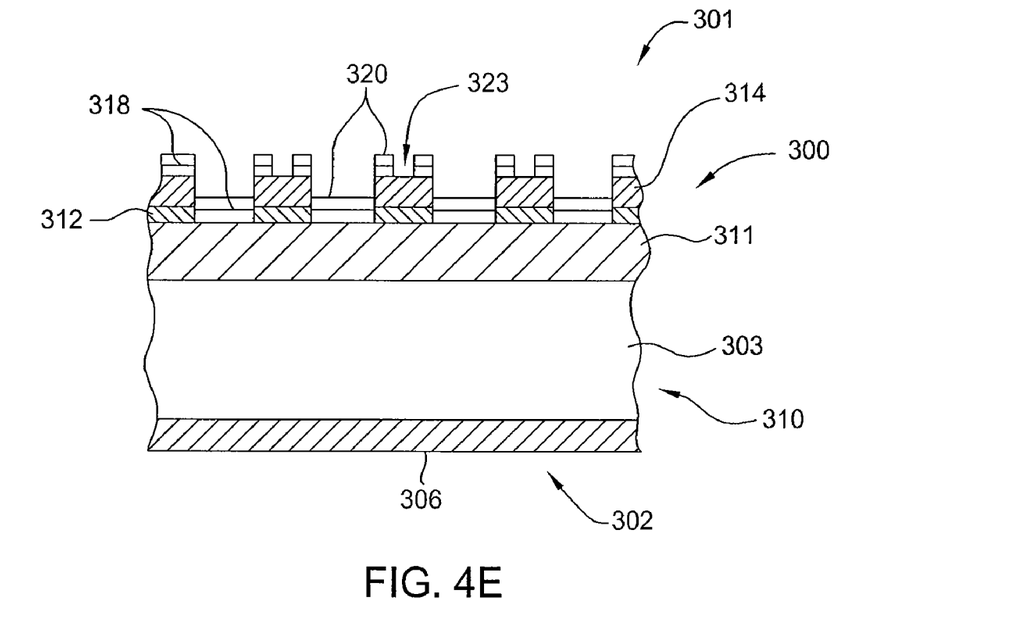

In optional step 514, selective portions of the barrier layer 320 and the seed layer 318 that are deposited over the sacrificial polymer layer 314 are removed as shown in FIG. 4E to form openings 323. In one embodiment, the openings 323 in the layers 320 and 318 are selectively formed via a laser ablation technique.

Figure 4F:
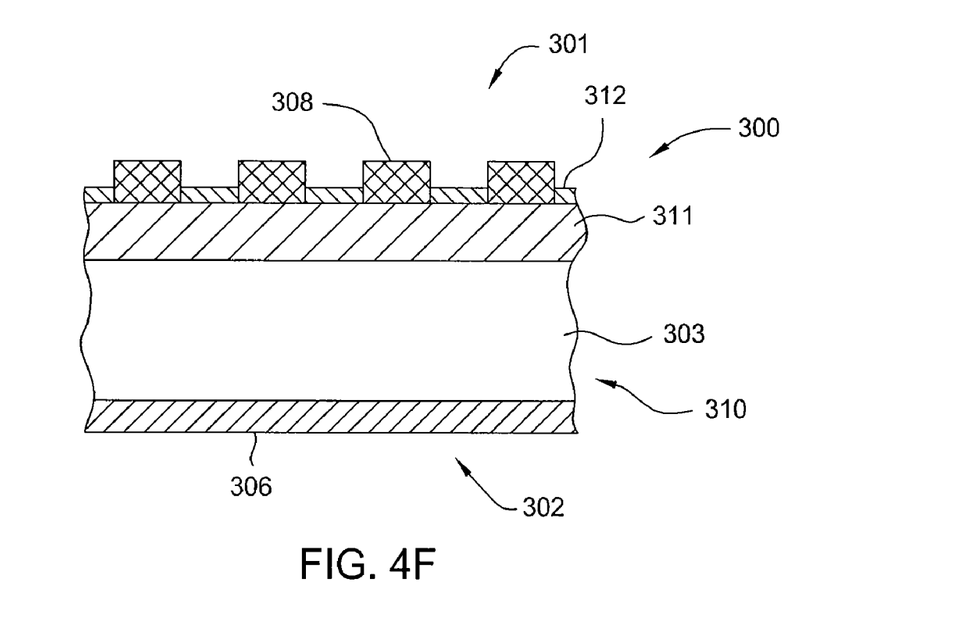

In step 516, a water-based solvent is introduced to the front side of the solar cell 300. In one embodiment, the water-based solvent is deionized water. The water-based solvent migrates through any openings provided in the layers 320 and 318 to contact the sacrificial polymer layer 314. The water-based solvent dissolves the sacrificial polymer layer 314 allowing lift off of the layers 320 and 318 that were deposited over the sacrificial polymer layer 314 leaving a solar cell 300 with one or more combination seed (318)/barrier (320) layers for completion of front contact lines 308 formed on the front surface 301 thereof as shown in FIG. 4F. As shown in FIG. 4F, the front contact lines 308 are completed by selectively plating or screen printing a conductive metal, such as silver, over the seed layer 318 and barrier layer 320.

Figure 6:
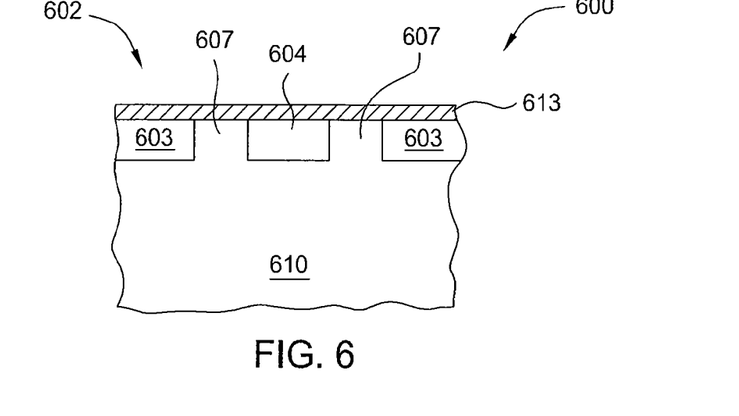
FIG. 6 is a schematic, cross-sectional view of the backside of a solar cell.

FIG. 6 schematically depicts a back surface 602 of a solar cell 600 prior to interdigitated back contact metallization. The solar cell 600 comprises a substrate 610 with alternating p-type regions 603 and n-type regions 604 separated by isolation regions 607. Additionally, the back surface 602 of the substrate 600 may have an ARC layer 613 disposed thereover. The ARC layer 613 may comprise a dielectric material, such as silicon nitride ($Si_3N_4$), which acts to minimize light reflected from the top surface of the solar cell 600.

FIGS. 7A-7F are schematic, cross-sectional views of the solar cell 600 from FIG. 6 during different stages in a processing sequence 800 for forming conductive interdigitating contacts on the back side of the solar cell 600 according to one embodiment of the present invention. Correspondingly, FIG. 8 illustrates the processing sequence 800 for forming interdigitating conductive contacts on the solar cell 600 as shown in FIGS. 7A-7F.

Figure 7A:
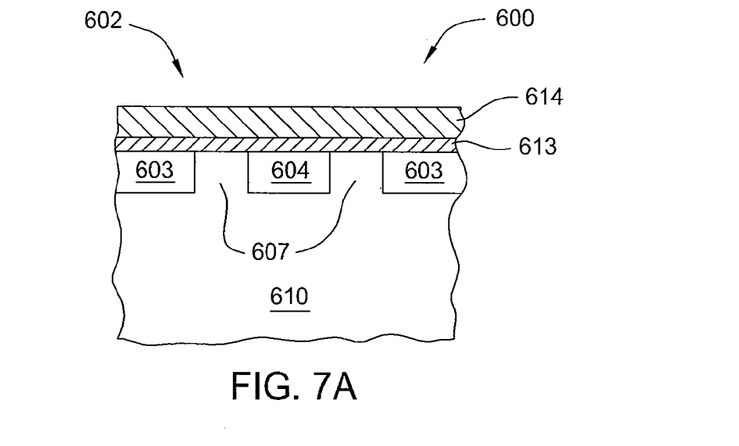
FIGS. 7A-7G are schematic, cross-sectional views of the solar cell in FIG. 6 during different stages in a processing sequence according to another embodiment of the present invention.
Figure 8:
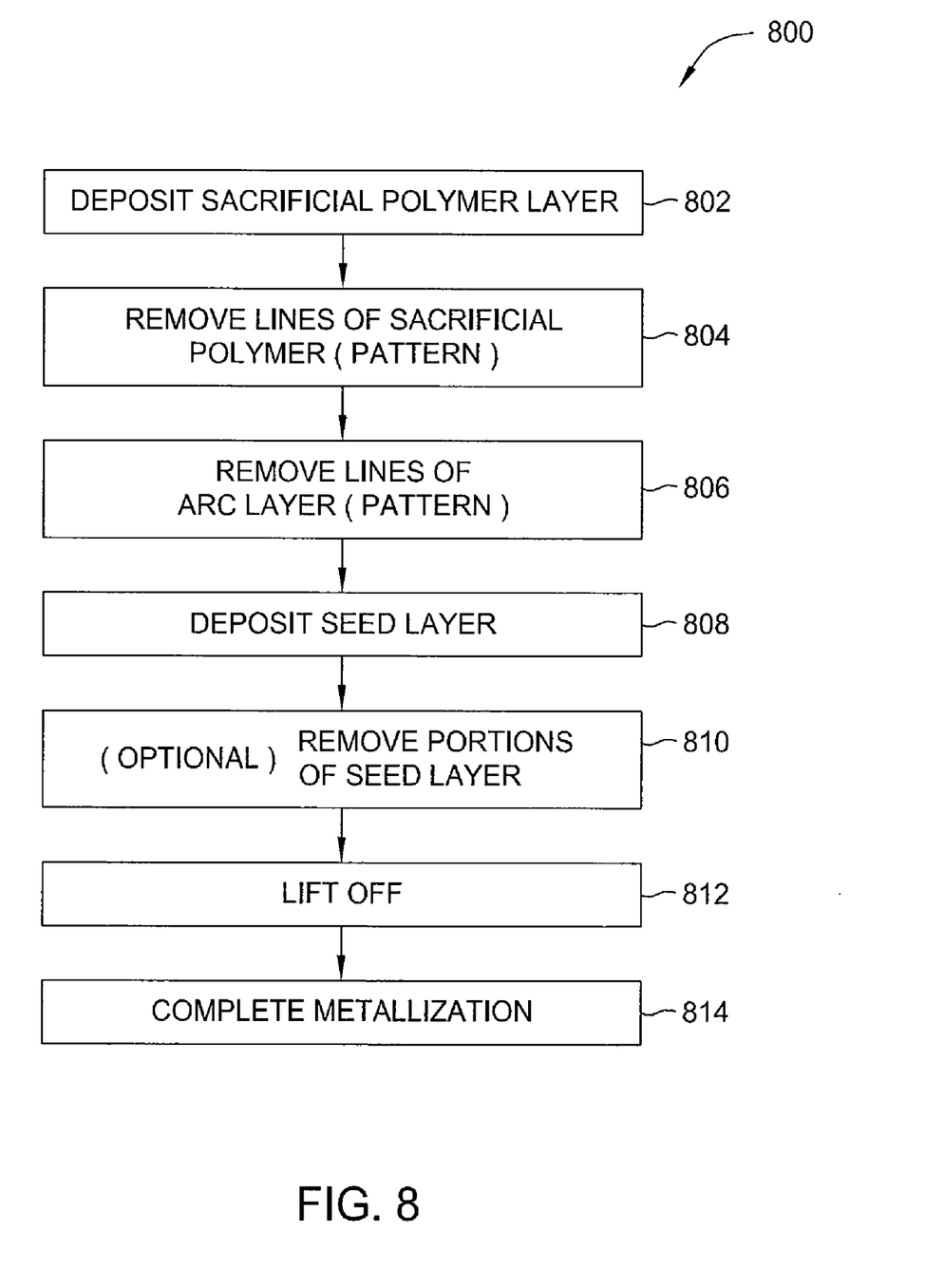
FIG. 8 depicts a processing sequence for forming conductors in a pattern on a solar cell according to one embodiment of the present invention.

In step 802, as illustrated in FIG. 7A, a sacrificial polymer layer 614 is deposited over the ARC layer 613. In one embodiment, the sacrificial polymer layer 614 comprises a water soluble material, such as polyvinyl acetate (PVA). In one embodiment, the sacrificial polymer layer 614 is formed to a thickness of at least about 200 Å. In one embodiment, the sacrificial polymer layer 614 is cured at a temperature from between about 100° C. to about 400° C. After curing the sacrificial polymer layer 614 comprises a substantially solid layer of water soluble material covering the front side of the solar cell 600.

Figure 7B:
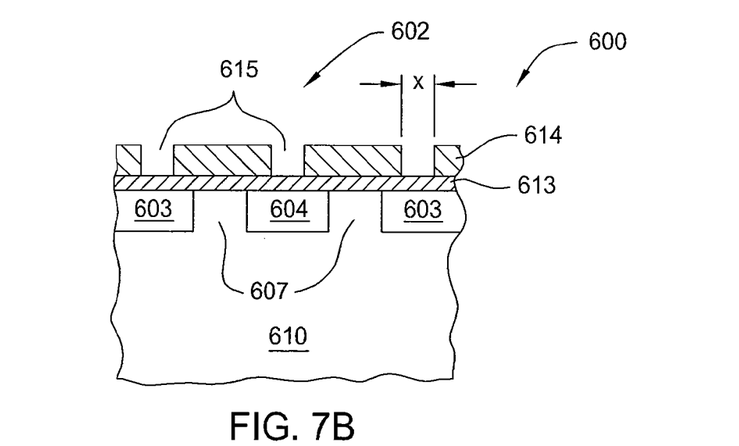

In step 804, as illustrated in FIG. 7B, one or more thin lines 615 of the sacrificial polymer layer 614 are removed via a high speed fluid jet. In one embodiment, the fluid used to remove the lines 615 of the sacrificial polymer layer 614 is a water-based solvent. In one embodiment, the fluid used to remove the lines 615 of the sacrificial polymer layer 614 is deionized water. In one embodiment, the sacrificial polymer layer 614 is removed in lines 615 each having a width (X) from about 25 microns to about 50 microns. In one embodiment, the sacrificial polymer layer 614 is removed in lines 615 each having a width (X) from about 25 microns to about 30 microns.

Figure 7C:
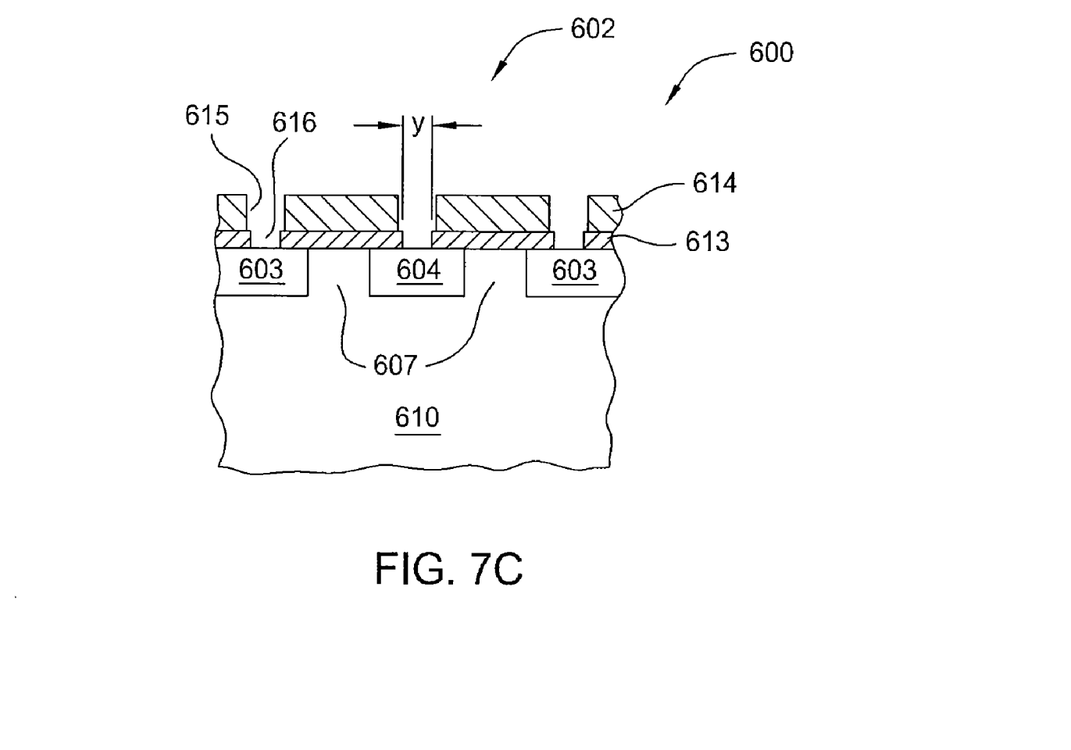
Figure 7D:
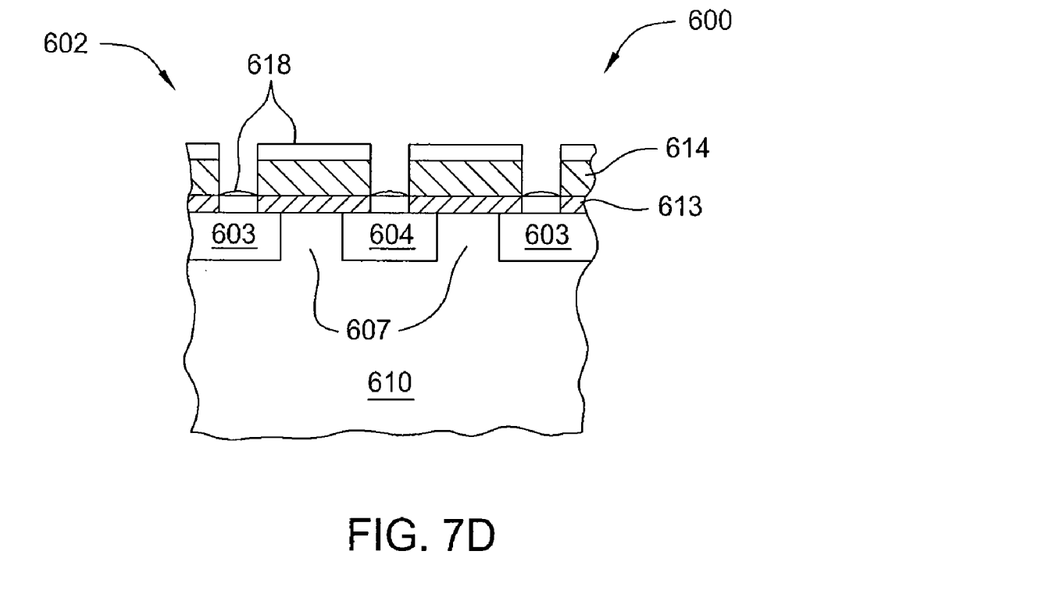

In step 806, the portion of the ARC layer 613 exposed by the removal of the thin lines 615 of sacrificial polymer layer 614 in step 804 is removed as depicted in FIG. 7C. That is, thin lines 616 of the ARC layer 613 are removed corresponding to the thin lines 615 of previously removed sacrificial polymer layer 614. In one embodiment, the thin lines 616 of the ARC layer 613 are removed via a wet etching process. In another embodiment, the thin lines 616 of the ARC layer 613 are removed via a laser ablation process. In the latter embodiment, the width (Y) of each of the thin lines 616 of the ARC layer 613 may be less than the width (X) of each of the thin lines 615 of the sacrificial polymer layer 614 removed in step 804 and shown in FIG. 7B In step 808, a nickel (Ni) seed layer 618 is deposited as shown in FIG. 7D. In one embodiment, the layer 618 may be deposited via physical vapor deposition (PVD), evaporation, or electroless plating. In one embodiment, the seed layer 618 is deposited at a thickness of less than about 200 Å.

Figure 7E:
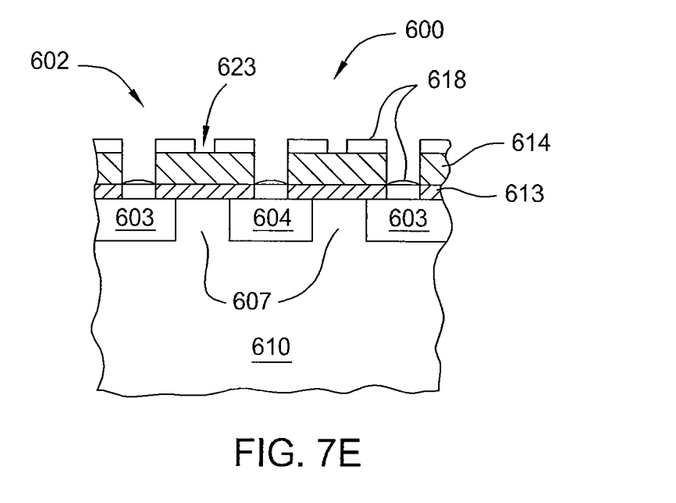

In optional step 810, selective portions of the seed layer 618 that are deposited over the sacrificial polymer layer 614 are removed as shown in FIG. 7E to form openings 623. In one embodiment, the seed 118 is selectively removed via a laser ablation technique.

Figure 7F:
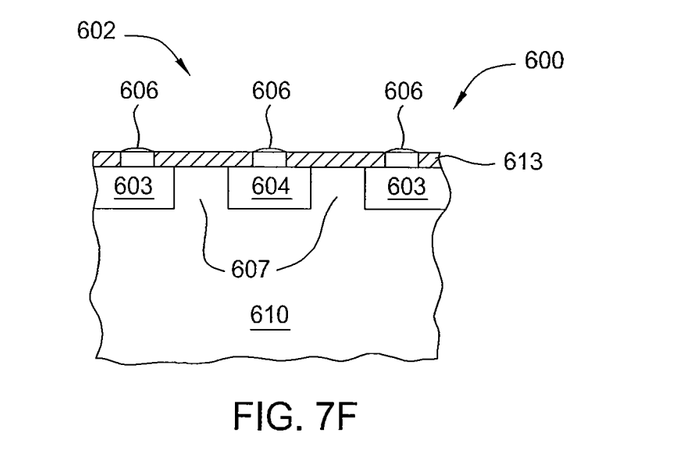

In step 812, a water-based solvent is introduced to the front side of the solar cell 600. In one embodiment, the water-based solvent is deionized water. The water-based solvent migrates through any openings provided in the seed 618 to contact the sacrificial polymer layer 614. The water-based solvent dissolves the sacrificial polymer layer 614 allowing lift off of the seed layer 618 that was deposited over the sacrificial polymer layer 614 leaving a solar cell 600 with one or more back contact seed lines 606 formed on the back surface 602 of the solar cell 600 as shown in FIG. 7F.

Figure 7G:
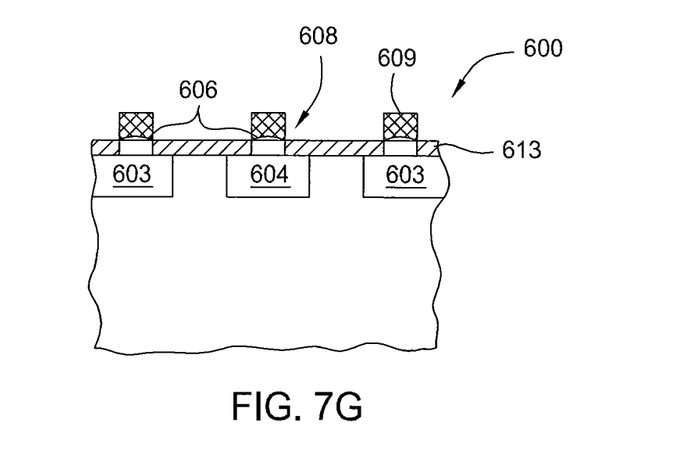

In step 814, metallization of the back contact seed lines 606 may be completed by selectively depositing a metal layer 609, such as copper, over the back contact seed lines 606 to form, in one example, an interdigitated back contact line structure 608 as shown in FIG. 7G. Portions of the interdigitated back contact line structure 608 will connect p-type regions 603 together and other portions will connect the n-type regions 604 together.

Therefore, embodiments of the present invention provide methods for forming current carrying metal lines on solar cells that reduce shading of the surface of the solar cell, decrease the sheet resistance of the deposited metal lines, and decrease the contact resistance to the emitter and base of the solar cell as well as reduce or eliminate other shortcomings of prior art methods.

While the foregoing is directed to embodiments of the present invention, other and further embodiments of the invention may be devised without departing from the basic scope thereof, and the scope thereof is determined by the claims that follow.

The invention claimed is:

1. A method for forming a patterned conductor on a solar cell, comprising:
    depositing a sacrificial polymer layer over a surface of the solar cell;
    directing a fluid stream at the sacrificial polymer layer;
    removing a portion of the sacrificial polymer layer;
    depositing a metal containing layer over the solar cell;
    introducing a water-based solvent to the solar cell; and
    dissolving the remaining sacrificial polymer layer.

2. The method of claim 1, wherein the sacrificial polymer layer comprises a water soluble material.

3. The method of claim 2, wherein the fluid stream comprises a jet of water-based fluid.

4. The method of claim 3, wherein the water-based fluid is deionized water.

5. The method of claim 3, wherein removing a portion of the sacrificial polymer layer includes patterning a series of grooves in the sacrificial polymer.

6. The method of claim 3, further comprising removing a portion of an antireflective layer from the surface of the solar cell.

7. The method of claim 6, wherein the portion of the antireflective layer is removed via laser ablation.

8. The method of claim 6, further comprising removing a portion of the metal containing layer.

9. The method of claim 3, wherein the metal containing layer comprises a seed layer.

10. The method of claim 9, wherein the metal containing layer further comprises a barrier layer.

11. A method for forming a patterned conductor on a solar cell, comprising:
    depositing a sacrificial polymer layer over a surface of the solar cell, wherein the sacrificial polymer layer comprises a water soluble material;
    curing the sacrificial polymer layer to a substantially solid state;
    directing a water-based fluid stream at the sacrificial polymer layer;
    removing a portion of the sacrificial polymer layer, wherein one or more lines are formed through the sacrificial polymer layer;
    depositing a metal containing seed layer over the solar cell;
    introducing a water-based solvent to the solar cell; and
    dissolving the remaining sacrificial polymer layer to remove a portion of the metal containing layer deposited over the sacrificial polymer layer.

12. The method of claim 11, further comprising removing a portion of a dielectric layer deposited beneath the sacrificial polymer layer.

13. The method of claim 12, further comprising removing the portion of the dielectric layer through the one or more lines formed through the sacrificial layer.

14. The method of claim 13, wherein the water-based fluid stream consists of deionized water.

15. The method of claim 14, wherein the water-based solvent consists of deionized water.

16. The method of claim 13, further comprising depositing a barrier layer over the metal containing seed layer.

17. The method of claim 16, further comprising depositing a metal layer over the barrier layer.

18. The method of claim 17, further comprising removing a portion of each of the metal layer, the seed layer, and the barrier layer prior to introducing the water-based solvent.

19. A method for forming a patterned conductor on a solar cell, comprising:
    depositing a sacrificial polymer layer over an antireflective layer formed over a surface of the solar cell, wherein the sacrificial polymer layer comprises polyvinyl acetate;
    heating the sacrificial polymer layer to cure the polymer to a substantially solid state;
    directing a jet of deionized water at the sacrificial polymer layer;
    removing a portion of the sacrificial polymer layer by forming one or more lines through the sacrificial polymer layer;
    laser ablating a portion of the antireflective layer exposed by forming the lines;
    depositing a metal containing layer over the solar cell;
    introducing deionized water to the solar cell; and
    dissolving the remaining sacrificial polymer layer to remove a portion of the metal containing layer deposited over the sacrificial polymer layer.

20. The method of claim 19, wherein the metal containing layer comprises a seed layer, a barrier, layer, and a bulk copper layer.

* * * * *